United States Patent
Furukawa et al.

(10) Patent No.: US 9,099,981 B2
(45) Date of Patent: Aug. 4, 2015

(54) ACOUSTIC WAVE DEVICE HAVING AN INORGANIC INSULATOR AND AN ORGANIC INSULATOR

(75) Inventors: Mitsuhiro Furukawa, Hyogo (JP); Tetsuhiro Korechika, Osaka (JP); Shinji Harada, Osaka (JP)

(73) Assignee: SKYWORKS PANASONIC FILTER SOLUTIONS JAPAN CO., LTD., Osaka (JP)

( * ) Notice: Subject to any disclaimer, the term of this patent is extended or adjusted under 35 U.S.C. 154(b) by 427 days.

(21) Appl. No.: 13/511,508

(22) PCT Filed: Jan. 20, 2011

(86) PCT No.: PCT/JP2011/000279
§ 371 (c)(1),
(2), (4) Date: May 23, 2012

(87) PCT Pub. No.: WO2011/089906
PCT Pub. Date: Jul. 28, 2011

(65) Prior Publication Data
US 2012/0279795 A1    Nov. 8, 2012

(30) Foreign Application Priority Data
Jan. 20, 2010   (JP) .................................. 2010-009777

(51) Int. Cl.
*H03H 9/145*   (2006.01)
*H03H 9/64*    (2006.01)
*H03H 9/02*    (2006.01)

(52) U.S. Cl.
CPC ....... *H03H 9/02992* (2013.01); *H03H 9/02937* (2013.01)

(58) Field of Classification Search
CPC .......... H03H 9/02929; H03H 9/02937; H03H 9/02984; H03H 9/02992; H03H 9/6489
USPC ......................... 333/133, 193–196, 150–155; 310/313 B, 313 D
See application file for complete search history.

(56) References Cited

U.S. PATENT DOCUMENTS 6,246,148 B1 *   6/2001   Flowers et al. ............ 310/313 B
7,075,391 B2 *   7/2006   Nakamura et al. ............. 333/193

(Continued)

FOREIGN PATENT DOCUMENTS

JP   8-97671     *  4/1996
JP   10-178330   *  6/1998

(Continued)

OTHER PUBLICATIONS

English language machine translation of JP 2006-324894, published Nov. 30, 2006.*

(Continued)

*Primary Examiner* — Barbara Summons
(74) *Attorney, Agent, or Firm* — Lando & Anastasi, LLP

(57) ABSTRACT

An acoustic wave device includes a piezoelectric substrate, a first wiring disposed on an upper surface of the piezoelectric substrate, an organic insulator covering at least a portion of the first wiring, a second wiring disposed on a first portion of the upper surface of the organic insulator, and an inorganic insulator covering at least a second portion of an upper surface of the organic insulator. The second portion of the upper surface of the organic insulator faces an oscillation space across the inorganic insulator. The acoustic wave device has preferable high-frequency characteristics and high long-term reliability.

20 Claims, 6 Drawing Sheets

(56) References Cited

U.S. PATENT DOCUMENTS

| | | |
|---|---|---|
| 7,486,159 B2 * | 2/2009 | Fujii et al. .................. 333/193 |
| 7,911,116 B2 * | 3/2011 | Aikawa et al. ............... 310/340 |
| 2004/0196119 A1 | 10/2004 | Shibahara |
| 2007/0075606 A1 * | 4/2007 | Inoue et al. ............... 310/313 R |
| 2008/0204167 A1 | 8/2008 | Takamine |

FOREIGN PATENT DOCUMENTS

| | | | |
|---|---|---|---|
| JP | 2002-26675 | * | 1/2002 |
| JP | 2004023201 A | | 1/2004 |
| JP | 2004282707 A | | 10/2004 |
| JP | 2005210475 A | | 8/2005 |
| JP | 2006-324894 | * | 11/2006 |
| JP | 2008153957 A | | 7/2008 |
| JP | 2009182407 A | | 8/2009 |
| JP | 2009-232138 | * | 10/2009 |
| WO | WO-2007055077 A1 | | 5/2007 |

OTHER PUBLICATIONS

English language Abstract only for JP 2009-182407, published Aug. 13, 2009.*

International Application Serial No. PCT/JP2011/000279, International Search Report mailed Mar. 22, 2011, 4 pgs.

* cited by examiner

ACOUSTIC WAVE DEVICE HAVING AN INORGANIC INSULATOR AND AN ORGANIC INSULATOR

THIS APPLICATION IS A U.S. NATIONAL STAGE APPLICATION OF THE PCT INTERNATIONAL APPLICATION NO. PCT/JP2011/000279.

TECHNICAL FIELD

The present invention relates to an acoustic wave device for use as a high-frequency filter in, for example, mobile communications devices.

BACKGROUND ART

In small communications apparatuses, such as mobile telephones, acoustic wave devices are commonly used as high-frequency filters having passing frequency range from tens of megahertz to several gigahertz.

FIG. 3A is a top view of a piezoelectric substrate 2 of a conventional acoustic wave device 1. FIG. 3B is a cross sectional view of the acoustic wave device 1 along line 3B-3B shown in FIG. 3A. The acoustic wave device 1 includes the piezoelectric substrate 2 made of a single crystal piezoelectric substance, such as lithium tantalate or lithium niobate, and comb-shaped electrodes 3 disposed on a surface of the piezoelectric substrate 2. The acoustic wave device 1 forms a filter circuit with comb-shaped electrodes 3 generating acoustic waves.

In the acoustic wave device 1, high-frequency currents flowing in the comb-shaped electrodes 3 affect each other particularly at a point where one wiring connected to the comb-shaped electrode 3 is close to another wiring. This influence generates a parasitic factor, such as a parasitic capacitance or inductance, hence causing insertion loss or decay to decline the high-frequency filtering characteristics of the acoustic wave device 1. Since a single crystal piezoelectric substance applicable to the piezoelectric substrate 2 generally is a highly dielectric material having a dielectric constant typically higher than 20, wirings disposed on the piezoelectric substrate 2 likely generate such parasitic factor. For suppressing the parasitic factors, an insulator 6 is disposed between wirings 4 and 5 which cross one over the other, another insulator 8 is disposed between the piezoelectric substrate 2 and a wiring 7, or a further insulator 10 is disposed on a wiring 9. The insulators 6, 8, and 10 are made of a resin material which can easily form a thick layer as favorably selected from known low dielectric constant materials and can thus suppress the parasitic factors generated in those wirings. The piezoelectric substrate 2 is covered at the upper surface with a sealing material 10A so that an oscillation space for the comb-shaped electrodes 3 is produced above.

An acoustic wave device similar to the conventional acoustic wave device 1 is disclosed in Patent Literature 1.

Recently, a demand for improving the reliability of mobile communications apparatuses has been intensified in view of the particular use under a high moisture condition for a long duration of time.

In the conventional acoustic wave device 1, the loading of a voltage under such a high moisture condition for a long duration of time may damage the resin material of the insulators 6, 8, and 10, and hence, result in declination of the reliability of the acoustic wave device 1.

An acoustic wave device similar to the conventional acoustic wave device 1 is disclosed in Patent Literature 1.

CITATION LIST

Patent Literature

Patent Literature 1: JP2004-282707A

SUMMARY OF THE INVENTION

An acoustic wave device includes a piezoelectric substrate, a first wiring disposed on an upper surface of the piezoelectric substrate, an organic insulator covering at least a portion of the first wiring, a second wiring disposed on a first portion of the upper surface of the organic insulator, and an inorganic insulator covering at least a second portion of an upper surface of the organic insulator. The second portion of the upper surface of the organic insulator faces an oscillation space across the inorganic insulator.

The acoustic wave device has preferable high-frequency characteristics and high long-term reliability.

DETAIL DESCRIPTION OF PREFERRED EMBODIMENTS

Exemplary Embodiment 1

Figure 1A:
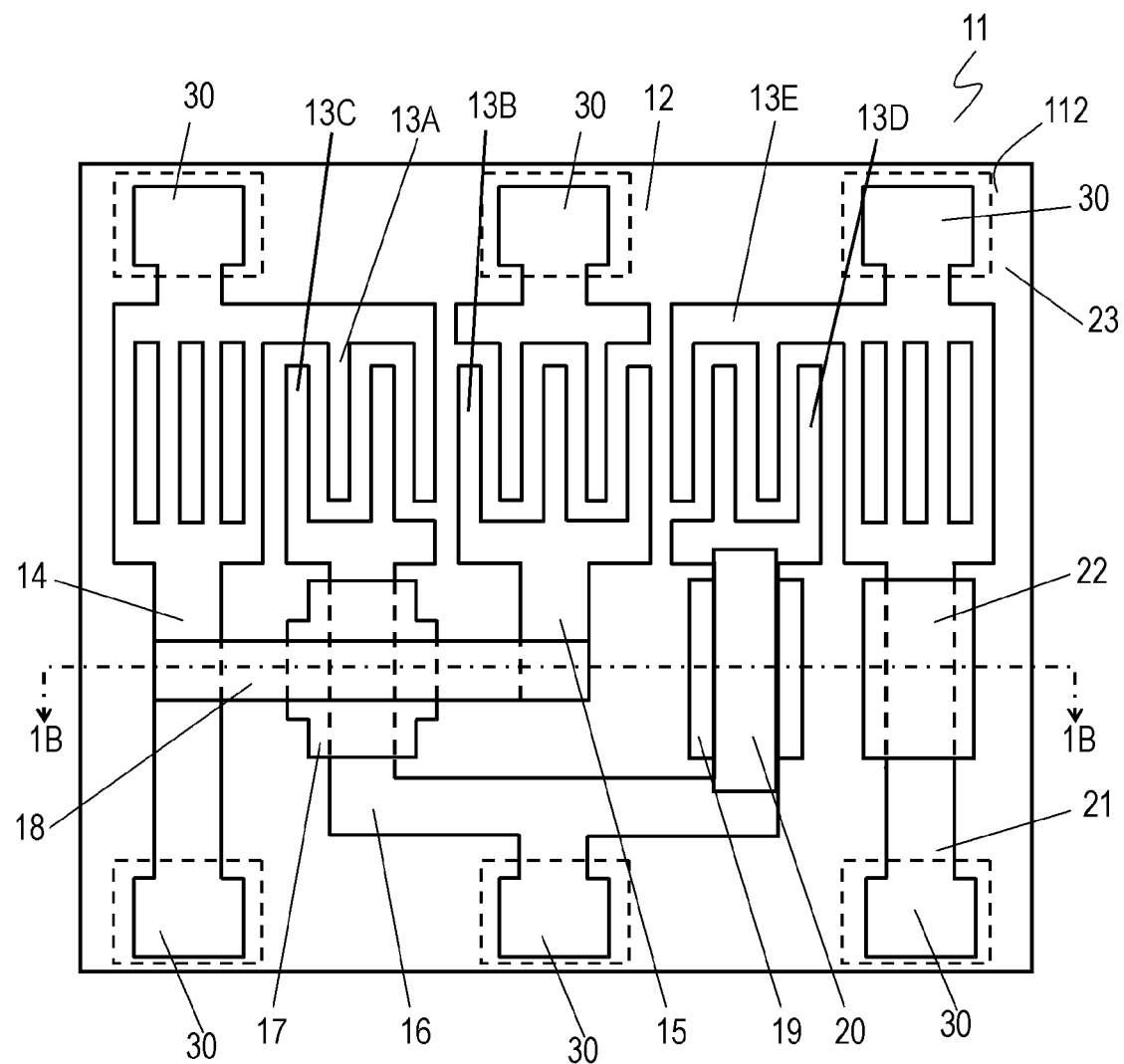
FIG. 1A is a top view of a piezoelectric substrate of an acoustic wave device according to Exemplary Embodiment 1 of the present invention.
Figure 1B:
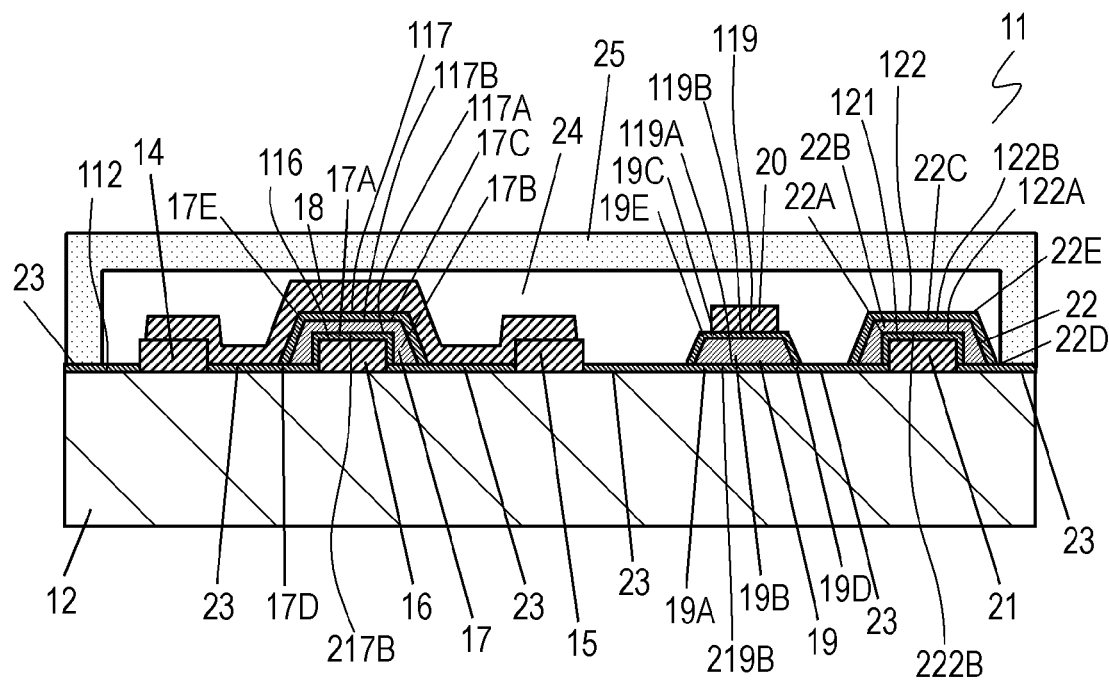
FIG. 1B is a cross sectional view of the acoustic wave device along line 1B-1B shown in FIG. 1A.

FIG. 1A is a top view of a piezoelectric substrate 12 of an acoustic wave device 11 according to Exemplary Embodiment 1 of the present invention. FIG. 1B is a cross sectional view of the acoustic wave device 11 along line 1B-1B shown in FIG. 1A.

The acoustic wave device 11 includes the piezoelectric substrate 12 and comb-shaped electrodes 13A to 13E disposed on an upper surface 112 of the piezoelectric substrate 12. The piezoelectric substrate 12 is made of a single crystal piezoelectric substance, such as lithium tantalate or lithium niobate. The comb-shaped electrodes 13A to 13E are arranged to excite an acoustic wave on the piezoelectric substrate 12 to allow the acoustic wave device 11 to constitute a filter circuit. The acoustic wave device 11 further includes wirings 14, 15, 16, 20, and 21 which are connected to the comb-shaped electrodes 13A, 13B, 13C, 13D, and 13E, respectively. The wirings 14, 15, 16, and 21 are disposed on the upper surface 112 of the piezoelectric substrate 12. The wirings 14 and 15 are connected to each other with a wiring 18. The wiring 18 crosses over the wiring 16. More particularly, an insulator 17 is disposed on an upper surface 116 of the wiring 16 to cover the wiring 16. The wiring 18 is provided on an upper surface 117 of the insulator 17. The wiring 18 is located directly above the wiring 16 while facing the wiring 16 across the insulator 17. The wirings 14, 15, 16, 18, 20, and 21 are made of a conductive material and arranged to have a voltage applied thereto to activate the acoustic wave device 11.

An insulator 19 which has a low dielectric constant is disposed on the upper surface 112 of the piezoelectric substrate 12. The wiring 20 is disposed on the upper surface 119 of the insulator 19. This arrangement improves the high-frequency characteristics of the wiring 20.

The wiring 21 connected with the comb-shaped electrode 13E is disposed on the upper surface 112 of the piezoelectric substrate 12. An insulator 22 is disposed on an upper surface 121 of the wiring 21. The insulator 22 suppresses electromagnetic coupling between the wirings 20 and 21 which are located adjacent to each other. An oscillation space 24 is formed above the upper surfaces 117, 119, and 122 of insulators 17, 19, and 22.

As described above, the insulators 17 and 22 cover at least portions of the wirings 16 and 21, respectively. The insulator 19 covers at least a portion of the upper surface 112 of the piezoelectric substrate 12.

The upper surface 112 of the piezoelectric substrate 12 is sealed with a sealing material 25 while the comb-shaped electrode 13 forms the oscillation space 24 above the comb-shaped electrode 13 for exciting the piezoelectric substrate 12.

Figure 1C:
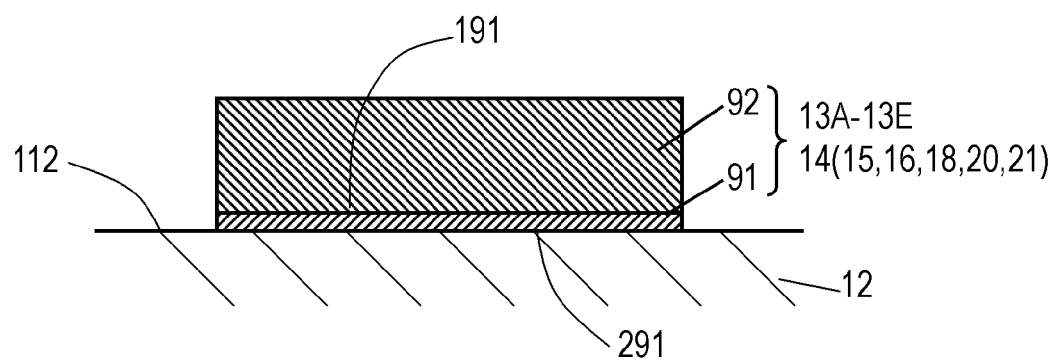
FIG. 1C is a cross sectional view of a comb-shaped electrode and a wiring of the acoustic wave device according to Embodiment 1.

FIG. 1C is a cross sectional view of the comb-shaped electrodes 13A to 13E and the wirings 14, 15, 16, 18, 20, and 21. Each of the comb-shaped electrodes 13A to 13E and the wirings 14, 15, 16, 18, 20, and 21 is a laminated conductor including a lower layer 91 having a lower surface 291 thereof faces the upper surface 112 of the piezoelectric substrate 12 and an upper layer 92 disposed on an upper surface 191 of the lower layer 91. The upper layer 92 is made mainly of aluminum and has a thickness of substantially 1.4 μm. The lower layer 91 is made mainly of titanium and has a thickness of substantially 1000 Å.

As shown in FIG. 1B, the insulator 17 disposed between the wirings 16 and 18 includes an inorganic insulator 17A disposed on an upper surface 116 of the wiring 16 to cover the wiring 16, an organic insulator 17B disposed on an upper surface 117A of the inorganic insulator 17A to cover the inorganic insulator 17A, and an inorganic insulator 17C disposed on an upper surface 117B of the organic insulator 17B to cover the organic insulator 17B.

The insulator 19 disposed between the wiring 20 and the upper surface 112 of the piezoelectric substrate 12 includes an inorganic insulator 19A disposed on the upper surface 112 of the piezoelectric substrate 12 to cover the piezoelectric substrate 12, an organic insulator 19B disposed on an upper surface 119A of the inorganic insulator 19A to cover the inorganic insulator 19A, and an inorganic insulator 19C disposed on an upper surface 119B of the organic insulator 19B to cover the organic insulator 19B.

The insulator 22 covering the wiring 21 includes an inorganic insulator 22A disposed on the upper surface 121 of the wiring 21 to cover the wiring 21, an organic insulator 22B disposed on an upper surface 122A of the inorganic insulator 22A to cover the inorganic insulator 22A, and an inorganic insulator 22C disposed on an upper surface 122B of the organic insulator 22B to cover the organic insulator 22B.

Each of the inorganic insulators 17A, 17C, 19A, 19C, 22A, and 22C is made of a silicon nitride layer which has a thickness ranging substantially from 5 to 20 nm and a dielectric constant of 9.6. Each of the organic insulators 17B, 19B, and 22B is a polyimide layer which has a thickness ranging substantially from 1 to 3 μm and a dielectric constant of 2.8.

Figure 3A:
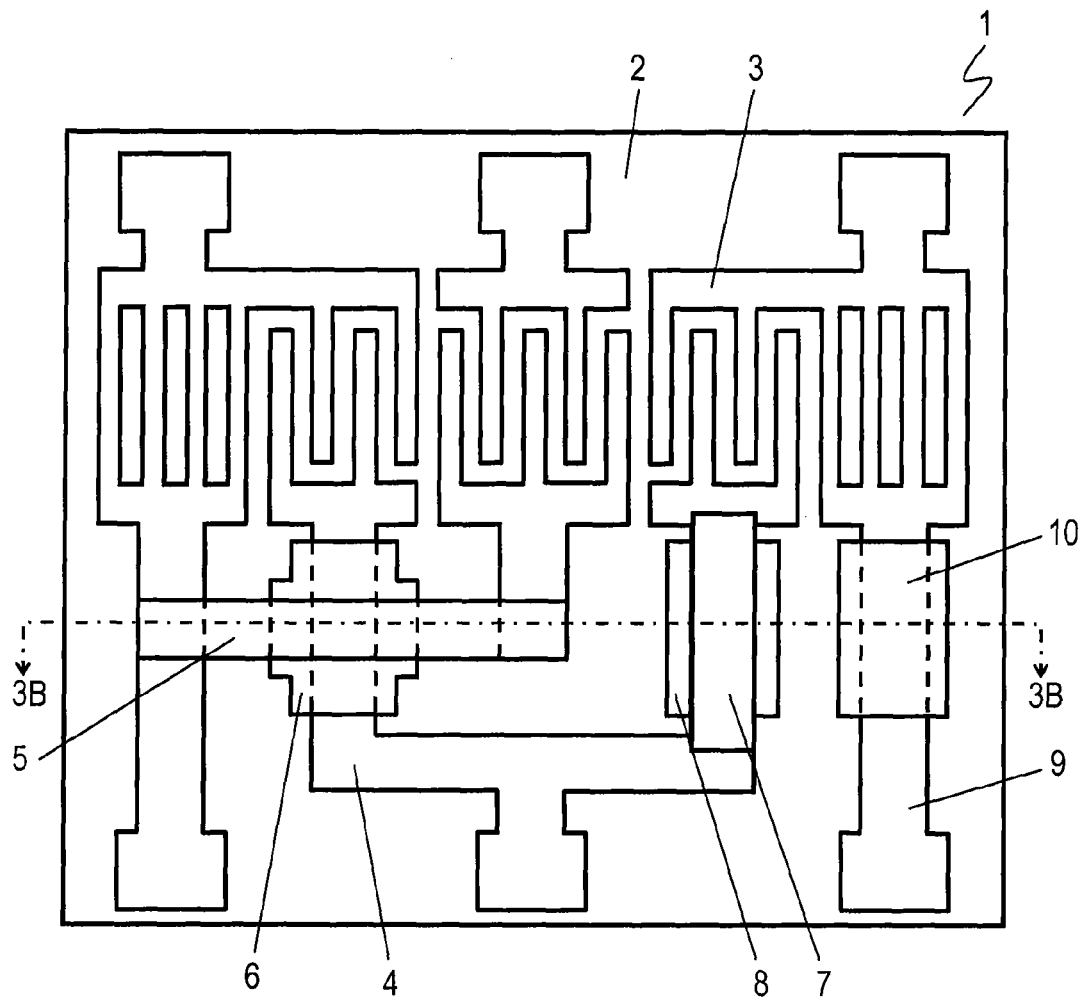
FIG. 3A is a top view of a piezoelectric substrate of a conventional acoustic wave device.
Figure 3B:
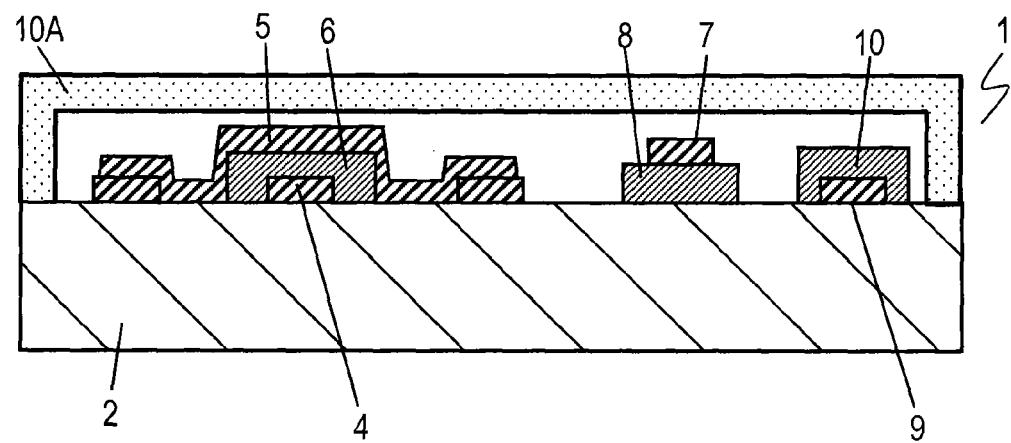
FIG. 3B is a cross sectional view of the conventional acoustic wave device along line 3B-3B shown in FIG. 3A.

In the conventional acoustic wave device 1 shown in FIGS. 3A and 3B, a voltage applied to the device under a high moisture condition for a long duration of time may damage a resin material of the insulators 6, 8, and 10 due to a hydrolytic reaction caused by a combination of the voltage applied to the wirings 4, 5, 7, and 9, heat generated during the oscillation of the comb-shaped electrodes 3, and water produced by condensation of dew in the oscillation space for oscillation of the comb-shaped electrodes 3, hence declining the reliability of the acoustic wave device 1.

In the acoustic wave device 11 according to Embodiment 1, the insulator 17 insulating between the two wirings 16 and 18 which cross one over the other includes the inorganic insulator 17A, the organic insulator 17B covering the inorganic insulator 17A, and the inorganic insulator 17C covering the organic insulator 17B. The organic insulator 17B easily has a large thickness and has a low dielectric constant. Consequently, the organic insulator 17B can effectively suppress the generation of a parasitic factor which is derived from the interference between the wirings 16 and 18 which cross one over the other. The organic insulator 17B sandwiched between the inorganic insulators 17A and 17C can improve a resistance to moisture. Accordingly, the organic insulator 17B can be protected from deterioration due to a hydrolytic reaction caused by the moisture and the voltage applied between the wirings 16 and 18, hence increasing the reliability of the acoustic wave device 11. The inorganic insulator 17A and the inorganic insulator 17C cover at least portions of the upper surface 117B and the lower surface 217B of the organic insulator 17B, respectively. This arrangement improves a resistance of the acoustic wave device 11 to moisture more as the covered portions are larger. In the case that the organic insulator 17B is covered entirely with the inorganic insulators 17A and 17C, the acoustic wave device 11 may further be improved in the resistance to moisture.

In the acoustic wave device 11 according to Embodiment 1, the insulator 19 disposed between the piezoelectric substrate 12 and the wiring 20 includes the inorganic insulator 19A, the organic insulator 19B covering the inorganic insulator 19A, and the inorganic insulator 19C covering the organic insulator 19B. The organic insulator 19B easily has a large thickness and has a low dielectric constant, thus reducing the adverse effect of the piezoelectric substrate 12 which has a high dielectric constant and effectively suppressing the generation of a parasitic factor in the wiring 20. The organic insulator 19B sandwiched between the inorganic insulators 19A and 19C can improve a resistance to moisture. Consequently, the organic insulator 19B can be protected from deterioration due to a hydrolytic reaction caused by the moisture and the voltage applied between the wiring 20 and an adjacent wiring, such as the wiring 21, hence increasing the reliability of the acoustic wave device 11. The inorganic insulator 19A and the inorganic insulator 19C cover at least portions of the upper surface 119B and the lower surface 219B of the organic insulator 19B, respectively. This arrangement improves a resistance of the acoustic wave device 11 to moisture more as the covered portions are larger. In the case that the organic insulator 19B is covered entirely with the inorganic insulators 19A and 19C, the acoustic wave device 11 may further be improved in the resistance to moisture.

In the acoustic wave device 11 according to Embodiment 1, the insulator 22 covering the wiring 21 includes the inorganic insulator 22A, the organic insulator 22B covering the inorganic insulator 22A, and the inorganic insulator 22C covering the organic insulator 22B. The organic insulator 22B easily has a large thickness and has a low dielectric constant, thus effectively suppressing the adverse effect of a parasitic factor generated between the wiring 21 and an adjacent wiring, such as the wiring 20. The organic insulator 22B sandwiched between the inorganic insulators 22A and 22C can improve the resistance to moisture. Consequently, the organic insulator 22B can be protected from deterioration due to a hydrolytic reaction caused by the moisture and the voltage applied between the wiring 21 and an adjacent wiring, such as the wiring 20, hence increasing the reliability of the acoustic wave device 11. The inorganic insulator 22A and the inorganic insulator 22C covers at least portions of the upper surface 122B and the lower surface 222B of the organic insulator 22B, respectively. This arrangement improves a resistance of the acoustic wave device 11 to moisture more as the covered portions are larger. In the case that the organic insulator 22B is covered entirely with the inorganic insulators 22A and 22C, the acoustic wave device 11 may further be improved in the resistance to moisture.

As described above, the organic insulators 17B, 19B, and 22B are entirely covered with the inorganic insulators 17A, 17C, 19A, 19C, 22A, and 22C so that they are not exposed to the oscillation space 24, thereby improving the acoustic wave device 11 effectively in the resistance to moisture.

According to Embodiment 1, the thickness of the organic insulator 17B is greater than the total thickness of the inorganic insulators 17A and 17C. The thickness of the organic insulator 19B is greater than the total thickness of the inorganic insulators 19A and 19C. The thickness of the organic insulator 22B is greater than the total thickness of the inorganic insulators 22A and 22C. The dielectric constant of the organic insulator 17B is lower than that of the inorganic insulators 17A and 17C. The dielectric constant of the organic insulator 19B is lower than that of the inorganic insulators 19A and 19C. The dielectric constant of the organic insulator 22B is lower than that of the inorganic insulators 22A and 22C. These structures allow insulators 17, 19, and 22 to have a low dielectric constant enough to effectively suppress the delay and loss of a high-frequency signal and the generation of a parasitic factor, thus improving the acoustic wave device 11 in the high-frequency characteristics. The dielectric constant of each of the inorganic insulators 17A, 17C, 19A, 19C, 22A, and 22C and the organic insulators 17B, 19B, and 22B is lower than that of the piezoelectric substrate 12.

The material of the inorganic insulators 17A, 17C, 19A, 19C, 22A, and 22C may be made of inorganic insulating material, such as including silicon dioxide, tantalum pentoxide, niobium pentoxide, tungsten oxide, or aluminum oxide, other than silicon nitride. The inorganic insulators 17A, 17C, 19A, 19C, 22A, and 22C may have small mechanical strength upon having a thickness smaller than 5 nm, and may have inner stresses accumulated therein to have cracks particularly at the bent locations upon having a thickness exceeding 50 nm. Thus, the thickness ranges preferably from 5 to 50 nm. In the case that the acoustic wave device 11 is used for filtering high-frequency signals of a gigahertz range, the inorganic insulators having a large thickness disturbs the excitation of an acoustic wave, and causes its characteristics to deteriorate. Accordingly, the thickness of the inorganic insulators 17A, 17C, 19A, 19C, 22A, and 22C range preferably from 5 to 20 nm.

The material of the organic insulators 17B, 19B, and 22B may be resin materials of not only polyimide resin, but also acrylic resin or epoxy resin, and preferably photo-setting resins due to an advantage for producing fine patterns by a photolithographic technique. The thickness of the organic insulators may range from 1 to 3 μm to reduce the parasitic factors at high frequencies, and can range from 1 to 20 μm for ensuring the mechanical strength.

An inorganic insulator 23 connected to the insulators 17, 19, and 22 may be disposed on the upper surface 112 of the piezoelectric substrate 12 and around the insulators 17, 19, and 22. The comb-shaped electrodes 13A to 13E and the wirings 14, 15, 16, and 21 are connected with pads 30. The inorganic insulator 23 is patterned not to cover the pads 30 to expose the pads 30. The inorganic insulators 17A, 19A, and 22A are joined to the inorganic insulators 17C, 19C, and 22C at outer edges 17D, 19D, and 22D on the upper surface 112 of the piezoelectric substrate 12. The inorganic insulator 23 is joined to the outer edges 17D, 19D, and 22D to mechanically reinforce the outer edges 17D, 19D, and 22D. This arrangement allows the inorganic insulators 17A and 17C to cover the organic insulator 17B to more rigidly, allows the inorganic insulators 19A and 19C to cover the organic insulator 19B more rigidly, and allows the inorganic insulators 22A and 22C to cover the organic insulator 22B more rigidly. Consequently, the acoustic wave device 11 can be improved more in reliability. The inorganic insulator 23, the inorganic insulators 17A, 19A, and 22A, and the inorganic insulators 17C, 19C, and 22C have thermal expansion coefficients substantially identical to each other. This reduces the stress pertinent to thermal hysteresis on the inorganic insulators, thus improving the reliability of the acoustic wave device 11.

Figure 1D:
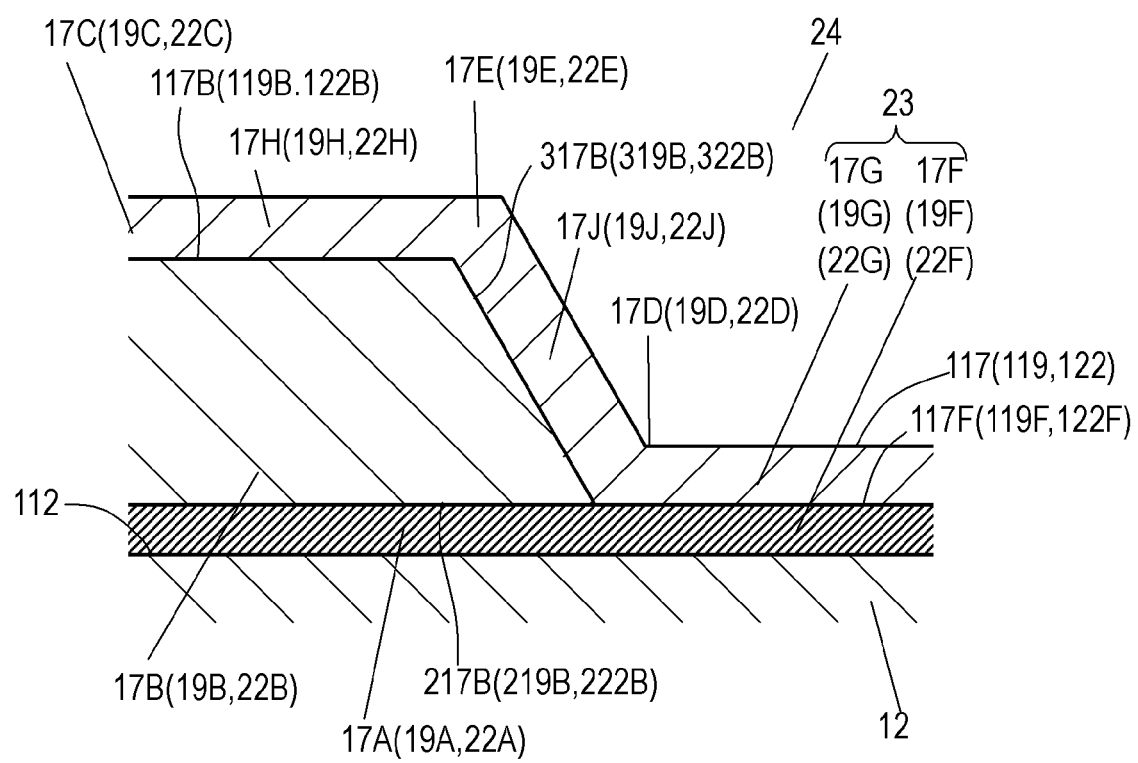
FIG. 1D is an enlarged cross sectional view of the acoustic wave device according to Embodiment 1.

FIG. 1D is an enlarged cross sectional view of the acoustic wave device 11, particularly showing the inorganic insulator 23. The inorganic insulator 17A has an extension 17F which extends from the organic insulator 17B across the outer edge 17D to the upper surface 112 of the piezoelectric substrate 12. The inorganic insulator 17C has an extension 17G which extends from the organic insulator 17B across the outer edge 17D to an upper surface 117F of the extension 17F of the inorganic insulator 17A. Similarly, the inorganic insulator 19A has an extension 19F which extends from the organic insulator 19B across the outer edge 19D to the upper surface 112 of the piezoelectric substrate 12. The inorganic insulator 19C has an extension 19G which extends from the organic insulator 19B across the outer edge 19D to an upper surface 119F of the extension 19F of the inorganic insulator 19A. Similarly, the inorganic insulator 22A has an extension 22F which extends from the organic insulator 22B across the outer edge 22D to the upper surface 112 of the piezoelectric substrate 12. The inorganic insulator 22C has an extension 22G which extends from the organic insulator 22B across the outer edge 22D to an upper surface 122F of the extension 22F of the inorganic insulator 22A. The inorganic insulator 23 is constituted by the extensions 17F and 17G of respective inorganic insulators 17A and 17C which are stacked. The inorganic insulator 23 is constituted by the extensions 19F and 19G of inorganic insulators 19A and 19C which are stacked. The inorganic insulator 23 is constituted by the extensions 22F and 22G of inorganic insulators 22A and 22C which are stacked. This layered structure allows the inorganic insulators 17A and 17C to cover the inorganic insulator 17B more rigidly, allows the inorganic insulators 19A and 19C to cover the inorganic insulator 19B more rigidly, and allows the inorganic insulators 22A and 22C to cover the inorganic insulator 22B more rigidly. This structure provides the acoustic wave device 11 with more reliability.

Along a cross section of the insulators 17, 19, and 22, each of the outer edges 17D, 19D, and 22D of the insulators 17, 19, and 22 may form an acute angle with respect to the upper surface 112 of the piezoelectric substrate 12. This arrangement increases the mechanical strength at the outer edges 17D, 19D, and 22D where the inorganic insulators 17A, 19A, and 22A are joined to the inorganic insulators 17C, 19C, and 22C, respectively, thereby improving the acoustic wave device 11 more in the reliability. As shown in FIG. 1A, the outer edge 17D of the insulator 17 where the wirings 16 and 18 cross one over the other forms an acute angle. This arrangement allows the wiring 18 disposed on the upper surface 117 of the insulator 17 to bend at an obtuse angle where the wiring 18 contacts the piezoelectric substrate 12. Accordingly, the stress on the wiring 18 can be reduced and the reliability at the location where the wirings 16 and 18 cross one over the other can be improved.

As shown in FIG. 1D, the organic insulator 17B further has a side surface 317B thereof which extends from the upper surface 117B to the lower surface 217B of the organic insulator 17B. The inorganic insulator 17C includes a portion 17H disposed on the upper surface 117B of the organic insulator 17B and a portion 17J disposed on the side surface 317B of the organic insulator 17B. Similarly, the organic insulator 19B further has a side surface 319B thereof which extends from the upper surface 119B to the lower surface 219B. The inorganic insulator 19C includes a portion 19H disposed on the upper surface 119B of the organic insulator 19B and a portion 19J disposed on the side surface 319B of the organic insulator 19B. Similarly, the organic insulator 22B further has a side surface 322B thereof which extends from the upper surface 122B to the lower surface 222B. The inorganic insulator 22C includes a portion 22H disposed on the upper surface 122B of the organic insulator 22B and a portion 22J disposed on the side surface 322B of the organic insulator 22B. The portions 17H, 19H, and 22H of the inorganic insulators 17C, 19C, and 22C are joined at obtuse angles to the portions 17J, 19J, and 22J at edges 17E, 19E, and 22E, respectively. The edges 17E, 19E, and 22E face the oscillation space 24. The inorganic insulators 17C, 19C, and 22C are bent at the edges 17E, 19E, and 22E, respectively. Since the edges 17E, 19E, and 22E are configured at obtuse angles, the edges 17E, 19E, and 22E can reduce the stress of thermal expansion which results in increase and decrease of the dimensions. Accordingly, the inorganic insulators 17C, 19C, and 22C are prevented from breaking down at the edges 17E, 19E, and 22E, thus improving the acoustic wave device 11 in reliability. The insulator 17 is configured at an obtuse angle on the edge 17E where the wirings 16 and 18 cross one over the other, the wiring 18 can be bent at an obtuse angle on the edge 17E of the insulator 17. Consequently, the stress on the wiring 18 can be reduced and the reliability at the crossing of the two wirings one over the other can be improved.

The acoustic wave device 11 according to Embodiment 1 can give significant advantages when it is employed as a high-frequency device, such as a surface acoustic wave device or a bulk acoustic wave device, in which oscillation space 24 provided in the interior is susceptible to the condensation of dew from moisture. Moreover, the acoustic wave device 11 is favorably applicable to a boundary acoustic wave device with the same effect of improving the reliability.

Exemplary Embodiment 2

Figure 2A:
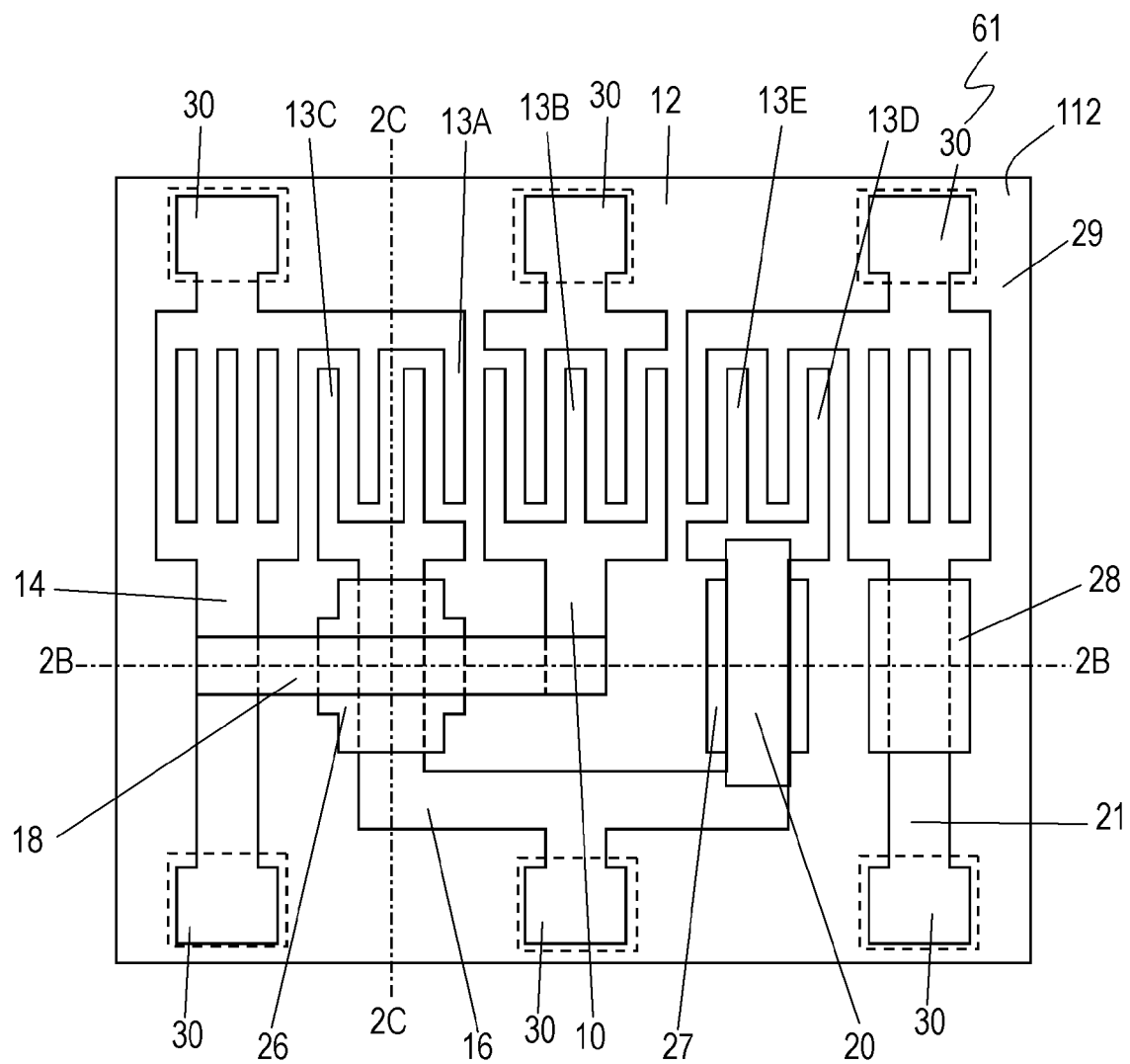
FIG. 2A is a top view of a piezoelectric substrate of an acoustic wave device according to Exemplary Embodiment 2 of the invention.
Figure 2B:
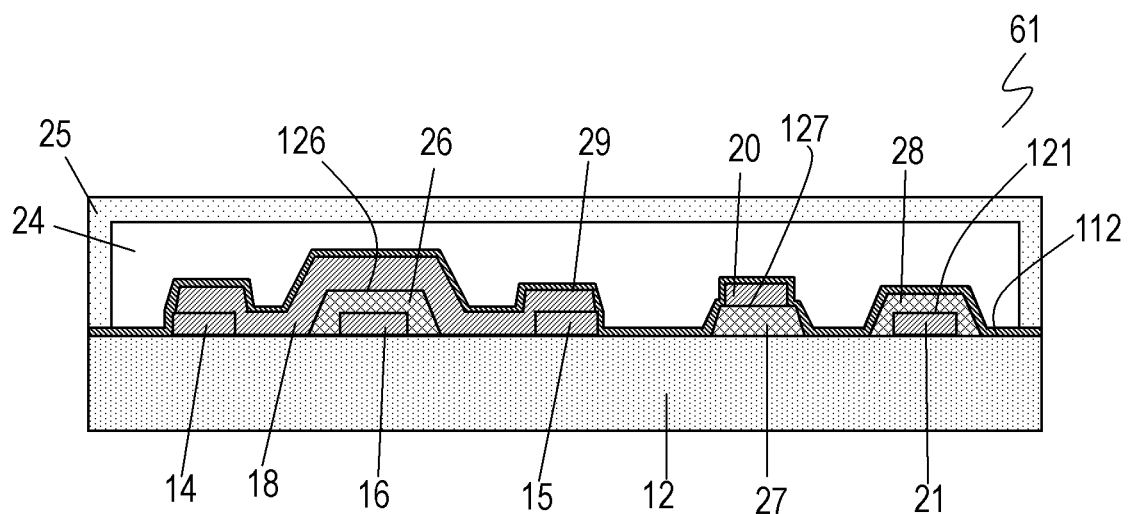
FIG. 2B is a cross sectional view of the acoustic wave device along line 2B-2B shown in FIG. 2A.
Figure 2C:
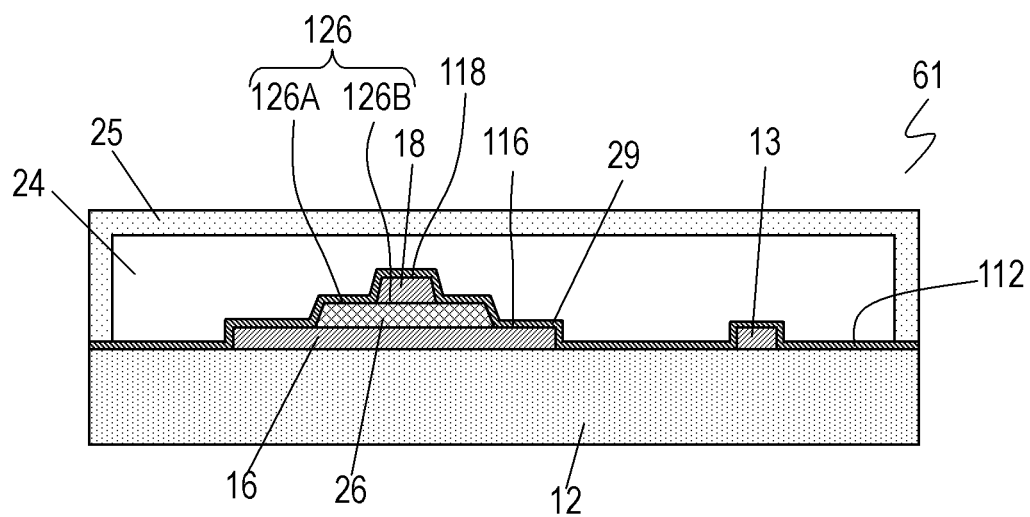
FIG. 2C is a cross sectional view of the acoustic wave device along line 2C-2C shown in FIG. 2A.

FIG. 2A is an upper view of the piezoelectric substrate 12 of an acoustic wave device 61 according to Exemplary Embodiment 2 of the present invention. FIG. 2B is a cross sectional view of the acoustic wave device 61 along lines 2B-2B shown in FIG. 2A. FIG. 2C is a cross sectional view of the acoustic wave device 61 along line 2C-2C shown in FIG. 2A. In FIGS. 2A to 2C, components identical to those of the acoustic wave device 11 according to Embodiment 1 shown in FIGS. 1A to 1D are denoted by the same reference numerals.

The acoustic wave device 61 according to Embodiment 2 is different from the acoustic wave device 11 according to Embodiment 1 in that a wiring and an organic insulator are covered with a single inorganic insulator and face an oscillation space 24 across the inorganic insulator.

In the acoustic wave device 61, wirings 16 and 18 on the upper surface 112 of the piezoelectric substrate 12 cross one over the other across an organic insulator 26 between wirings 16 and 18. An organic insulator 27 is disposed on the upper surface 112 of the piezoelectric substrate 12. A wiring 20 is disposed on an upper surface 127 of the organic insulator 27. An organic insulator 28 covers an upper surface 121 of a wiring 21 which is disposed on the upper surface 112 of the piezoelectric substrate 12. The upper surfaces of the wirings 16, 18, 20, and 21 and the organic insulators 26, 27, and 28 face the oscillation space 24 via an inorganic insulator 29 but none of the wirings 16, 18, 20, and 21 and the organic insulators 26, 27, and 28 is exposed to the oscillation space 24. The top view of FIG. 2A illustrates an area covered with the inorganic insulator 29. Pads 30 are connected to comb-shaped electrodes 13A to 13E and the wirings 14, 15, 16, and 21. The inorganic insulator 29 is patterned not to cover the pads 30 to expose the pads 30.

The organic insulators 26, 27, and 28 are made of a polyimide layer having a thickness ranging from 1 to 3 μm and a dielectric constant of 2.8. The inorganic insulator 29 is made of a silicon nitride layer having a thickness ranging from 5 to 20 nm and a dielectric constant of 9.6. The material of the inorganic insulator 29 may be made of a silicon dioxide layer, and more preferably a silicon nitride layer which have low moisture permeability.

As described above, according to Embodiment 2, the organic insulator 26 is disposed for providing the insulation between the wirings 16 and 18 which cross one over the other. The inorganic insulator 29 covers at least a portion of an upper surface of the organic insulator 26 which faces the oscillation space 24. This structure allows the organic insulator 26, which easily forms a thick layer and has a low dielectric constant, to effectively suppress the generation of a parasitic factor which is derived from the interference between the wirings 16 and 18 which cross one over the other. This structure also improves a resistance to moisture, thus preventing the organic insulator 26 from deterioration due to a hydrolytic reaction caused by to the moisture and the voltage applied between the wirings 16 and 18, hence increasing the reliability of the acoustic wave device 61. The upper surfaces of organic insulator 26 and the wirings 16 and 18 which face the oscillation space 24 may be entirely covered with the inorganic insulator 29 so that the organic insulator 26 and the wirings 16 and 18 are not exposed to the oscillation space 24, thereby improving the acoustic wave device 61 effectively in the resistance to moisture.

According to Embodiment 2, the inorganic insulator 29 covers at least a portion of the upper surface of the organic insulator 27 disposed between the wiring 20 and the piezoelectric substrate 12. The upper surface of the organic insulator 27 faces the oscillation space 24. This structure allows the organic insulator 27, which easily forms a thick layer and has a low dielectric constant, to reduce the adverse effect of the piezoelectric substrate 12 which has a high dielectric constant, and effectively suppresses the generation of a parasitic factor in the wiring 20. This structure also increases its resistance to moisture, and prevents the organic insulator 27 from deterioration due to a hydrolytic reaction caused by the moisture and the voltage applied between the wiring 20 and an adjacent wiring, hence increasing the reliability of the acoustic wave device 61. The inorganic insulator 29 may cover entirely the upper surfaces of the organic insulator 27 and the wiring 20 which face the oscillation space 24 so that the organic insulator 27 and the wiring 20 are not exposed to the oscillation space 24, thereby improving the acoustic wave device 61 effectively in the resistance to moisture.

Moreover, according to Embodiment 2, the inorganic insulator 29 covers at least a portion of the upper surface of the organic insulator 28 covering the wiring 21. The upper surface of the organic insulator 28 faces the oscillation space 24. This structure allows the organic insulator 28, which easily forms a thick layer and has a low dielectric constant, to effectively suppress the generation of a parasitic factor between the wiring 21 and an adjacent wiring, such as the wiring 20. The structure also improves a resistance to moisture, thus preventing the organic insulator 28 from deterioration due to a hydrolytic reaction caused by the moisture and the voltage applied between the wiring 20 and an adjacent wiring, such as the wiring 21, hence increasing the reliability of the acoustic wave device 61. The inorganic insulator 29 may cover entirely the upper surfaces of the organic insulator 28 and the wiring 21 which face the oscillation space 24 so that the organic insulator 28 and the wiring 21 are not exposed to the oscillation space 24, thereby improving the acoustic wave device 61 effectively in the resistance to moisture.

As shown in FIGS. 2A to 2C, the comb-shaped electrodes 13A to 13E are disposed on the upper surface 112 of the piezoelectric substrate 12 so that the oscillation space 24 for exciting the piezoelectric substrate 12 is provided above the comb-shaped electrodes 13A to 13E. The wiring 16 is disposed on the upper surface 112 of the piezoelectric substrate 12. The organic insulator 26 covers at least a portion of the wiring 16. The wiring 18 is disposed on a portion 126B of the upper surface 126 of the organic insulator 26. The inorganic insulator 29 covers at least a portion 126A of the upper surface 126 of the organic insulator 26. The portion 126A of the upper surface 126 of the organic insulator 26 faces the oscillation space 24 across the inorganic insulator 29. This structure improves the acoustic wave device 61 in the resistance to moisture.

Moreover, the inorganic insulator 29 covers the portion 126A of the upper surface 126 of the organic insulator 26, the upper surface 116 of the wiring 16, and the upper surface 118 of the wiring 18. The portion 126A of the upper surface 126 of the organic insulator 26, the upper surface 116 of the wiring 16, and the upper surface 118 of the wiring 18 face the oscillation space 24 across the inorganic insulator 29. This structure improves the acoustic wave device 61 in the resistance to moisture.

In Embodiments 1 and 2, terms, such as "upper surface", "lower surface", "directly above", and "above", suggesting directions indicate relative directions depending only on the positional relationship between components, such as the piezoelectric substrate, the comb-shaped electrodes, the wirings, and the insulators, of the acoustic wave devices 11 and 61, but do not indicate absolute directions, such as a vertical direction.

INDUSTRIAL APPLICABILITY

An acoustic wave device according to the present invention has high reliability and is applicable to, e.g., high-frequency filters, antenna duplexers, employed in mobile communications devices.

REFERENCE NUMERALS

11 Acoustic Wave Device
12 Piezoelectric Substrate
13A Comb-Shaped Electrode
16 Wiring (First Wiring)
17 Insulator
17A Inorganic Insulator (First Inorganic Insulator)
17B Organic Insulator
17C Inorganic Insulator (Second Inorganic Insulator)
17D Outer Edge
18 Wiring (Second Wiring)
19 Insulator
19A Inorganic Insulator (First Inorganic Insulator)
19B Organic Insulator
19C Inorganic Insulator (Second Inorganic Insulator)
19D Outer Edge
21 Wiring
22 Insulator
22A Inorganic Insulator (First Inorganic Insulator)
22B Organic Insulator
22C Inorganic Insulator (Second Inorganic Insulator)
22D Outer Edge
23 Inorganic Insulator (Third Inorganic Insulator)
24 Oscillation Space
26 Organic Insulator
28 Inorganic Insulator
61 Acoustic Wave Device

The invention claimed is:

1. An acoustic wave device comprising:
a piezoelectric substrate having an upper surface thereof;
a comb-shaped electrode disposed on the upper surface of the piezoelectric substrate and arranged to excite an acoustic wave on the piezoelectric substrate, the acoustic wave device including an oscillation space above the comb-shaped electrode;
a first wiring disposed on the upper surface of the piezoelectric substrate;
an organic insulator covering at least a portion of the first wiring;
a second wiring disposed on a first portion of an upper surface of the organic insulator; and
an inorganic insulator covering at least a second portion of the upper surface of the organic insulator and an upper surface of the second wiring the second wiring and the organic insulator being arranged such that the second portion of the upper surface of the organic insulator and the upper surface of the second wiring face the oscillation space across the inorganic insulator, a thickness of the organic insulator being greater than a thickness of the inorganic insulator, and a dielectric constant of the organic insulator being lower than a dielectric constant of the inorganic insulator.

2. The acoustic wave device of claim 1 wherein the inorganic insulator includes one of a silicon nitride layer and a silicon dioxide layer.

3. The acoustic wave device of claim 1 wherein the inorganic insulator prevents the first and second wirings and the organic insulator from being exposed to the oscillation space.

4. The acoustic wave device of claim 1 further comprising a third wiring disposed on a third portion of the upper surface of the organic insulator, the inorganic insulator further covering an upper surface of the third wiring such that the upper surface of the third wiring faces the oscillation space across the inorganic insulator.

5. The acoustic wave device of claim 1 wherein the inorganic insulator includes a silicon nitride layer having a thickness in a range of 5-20 nm.

6. An acoustic device comprising:
a piezoelectric substrate having an upper surface thereof;

a comb-shaped electrode disposed on the upper surface of the piezoelectric substrate;

a first wiring disposed on the upper surface of the piezoelectric substrate; and an insulator covering at least a portion of the first wiring, the insulator including a first inorganic insulator disposed on an upper surface of the first wiring an organic insulator covering the first inorganic insulator, and a second inorganic insulator covering the organic insulator, a thickness of the organic insulator being greater than a total thickness of the first inorganic insulator and the second inorganic insulator in combination, and a dielectric constant of the organic insulator being lower than a dielectric constant of the first inorganic insulator and a dielectric constant of the second inorganic insulator.

7. The acoustic wave device of claim 6 further comprising a second wiring disposed on an upper surface of the insulator.

8. The acoustic wave device of claim 6 further comprising a third inorganic insulator disposed on the upper surface of the piezoelectric substrate, the third inorganic insulator being connected to the insulator.

9. The acoustic wave device of claim 6 wherein a cross section of the insulator at an outer periphery thereof contacting the upper surface of the piezoelectric substrate has an acute angle.

10. The acoustic wave device of claim 6 wherein the piezoelectric substrate is a single crystal piezoelectric substrate including one of lithium tantalate and lithium niobate.

11. The acoustic wave device of claim 6 wherein the first and second inorganic insulators include silicon nitride.

12. The acoustic wave device of claim 11 wherein the organic insulator is a polyimide layer.

13. The acoustic wave device of claim 6 wherein the first wiring is connected to the comb-shaped electrode.

14. The acoustic wave device of claim 6 wherein the first inorganic insulator further covers a portion of the upper surface of the piezoelectric substrate.

15. An acoustic device comprising:

a piezoelectric substrate having an upper surface thereof;

a comb-shaped electrode disposed on the upper surface of the piezoelectric substrate;

an insulator covering at least a portion of the upper surface of the piezoelectric substrate, the insulator including a first inorganic insulator disposed on the upper surface of the piezoelectric substrate, an organic insulator covering the first inorganic insulator, and a second inorganic insulator covering the organic insulator, a thickness of the organic insulator being greater than a total thickness of the first inorganic insulator and the second inorganic insulator combined, and a dielectric constant of the organic insulator being lower than a dielectric constant of the first inorganic insulator and a dielectric constant of the second inorganic insulator; and a wiring disposed on an upper surface of the insulator.

16. The acoustic wave device of claim 15 further comprising a third inorganic insulator disposed on the upper surface of the piezoelectric substrate, the third inorganic insulator being connected to the insulator.

17. The acoustic wave device of claim 15 wherein a cross section of the insulator at an outer periphery thereof contacting the upper surface of the piezoelectric substrate has an acute angle.

18. The acoustic wave device of claim 15 wherein the piezoelectric substrate is a single crystal piezoelectric substrate including one of lithium tantalate and lithium niobate.

19. The acoustic wave device of claim 15 wherein the first and second inorganic insulators include silicon nitride.

20. The acoustic wave device of claim 19 wherein the organic insulator is a polyimide layer.

* * * * *